United States Patent
Wu et al.

(10) Patent No.: US 9,655,230 B2
(45) Date of Patent: May 16, 2017

(54) ELECTROMAGNETIC NOISE FILTER DEVICE AND EQUIVALENT FILTER CIRCUIT THEREOF

(71) Applicant: NATIONAL TAIWAN UNIVERSITY, Taipei (TW)

(72) Inventors: Tzong-Lin Wu, Taipei (TW); Chih-Ying Hsiao, Taipei (TW); Chien-Hua Hung, Taipei (TW)

(73) Assignee: National Taiwan University, Taipei (TW)

( * ) Notice: Subject to any disclaimer, the term of this patent is extended or adjusted under 35 U.S.C. 154(b) by 12 days.

(21) Appl. No.: 14/558,848

(22) Filed: Dec. 3, 2014

(65) Prior Publication Data

US 2016/0087323 A1    Mar. 24, 2016

(30) Foreign Application Priority Data

Sep. 19, 2014    (TW) .............................. 103132387 A

(51) Int. Cl.
 *H05K 1/02*    (2006.01)
 *H01P 3/08*    (2006.01)
 *H01P 1/203*   (2006.01)

(52) U.S. Cl.
 CPC ......... *H05K 1/0218* (2013.01); *H01P 1/2039* (2013.01); *H01P 3/081* (2013.01); *H05K 1/0253* (2013.01); *H05K 1/0227* (2013.01); *H05K 1/0245* (2013.01); *H05K 2201/09263* (2013.01)

(58) Field of Classification Search
 CPC .... H01P 1/20327; H01P 3/081; H01P 1/2039; H05K 1/0253; H05K 1/0227; H05K 1/0245; H05K 1/0218; H05K 2201/09263

USPC .................. 333/128, 134, 202, 204, 206
 See application file for complete search history.

(56) References Cited

U.S. PATENT DOCUMENTS

| | | | | |
|---|---|---|---|---|
| 6,819,199 B2* | 11/2004 | Burns | ....................... | H01P 5/10 333/26 |
| 7,126,444 B2* | 10/2006 | Fukunaga | ................. | H01P 5/10 333/204 |
| 7,868,718 B2* | 1/2011 | Yasuda | ............... | H01P 1/20381 333/204 |

(Continued)

FOREIGN PATENT DOCUMENTS

| TW | M385809 | 8/2010 |
|---|---|---|
| TW | 201233257 A | 8/2012 |

*Primary Examiner* — Robert Pascal
*Assistant Examiner* — Kimberly Glenn
(74) *Attorney, Agent, or Firm* — Rosenberg, Klein & Lee

(57) ABSTRACT

The present invention is related to an electromagnetic noise filter device and an equivalent filter circuit thereof. The filter device comprises a substrate, a transmission line and a ground plane having slotted ground structure. The transmission line is configured on the top surface of the substrate, and the grounding plane is configured on the bottom surface of the substrate. At least one pair of impedance elements are configured within the slotted ground structure. The transmission line can be electromagnetic coupled to the slotted ground structure and the impedance elements so as to form an equivalent filter circuit. Thereby, the electromagnetic noises on at least one specific frequency may be absorbed by the impedance elements of the filter device so as to avoid the electromagnetic reflection induced by the electromagnetic noise and interfering the signal transmitted on the transmission line.

8 Claims, 20 Drawing Sheets

(56) References Cited

U.S. PATENT DOCUMENTS

2010/0052820 A1 3/2010 Wu et al.
2012/0057323 A1 3/2012 Wu et al.
2012/0112857 A1 5/2012 Lim et al.

* cited by examiner

ELECTROMAGNETIC NOISE FILTER DEVICE AND EQUIVALENT FILTER CIRCUIT THEREOF

CROSS-REFERENCE TO RELATED APPLICATIONS

This non-provisional application claims priority claim under 35 U.S.C. §119(a) on Taiwan Patent Application No. 103132387 filed Sep. 19, 2014, the entire contents of which are incorporated herein by reference.

FIELD OF THE INVENTION

The present invention is related to a filter device and an equivalent filter circuit thereof, particularly to a filter device and an equivalent filter circuit thereof for absorbing the energy of electromagnetic noise.

BACKGROUND

As digital electronic products are advancing with each passing day, circuits of systems in the electronic products become more and more complex, and the problem of electromagnetic interference (EMI) or common-mode noise is then more serious, to be a significant barrier to normal operation of system.

To solve the problem of EMI, in the past, it is most common to use an electromagnetic material to achieve the suppression of EMI, in which the feature of high inductance of electromagnetic material is used to suppress the generation of EMI. However, the permeability of the electromagnetic material attenuates quickly in high frequency, in which condition makes the electromagnetic material not suitably in high-speed transmission interface with frequency section of GHz or above.

Alternatively, there is further provided with a multi-layered filter device fabricated by low/high temperature co-fired ceramics technology (LTCC/HTCC) due to recent progress in fabrication process. In spite of acceptable effect on suppression of EMI, the cost of fabrication process of LTCC/HTCC is extremely high, and the filter device is only capable of operating at low frequency range, for example, 750 MHz~1 GHz.

SUMMARY

It is one object of the present invention to provide an electromagnetic noise filter device and an equivalent filter circuit thereof, in which a pair of pair of impedance elements are configured therein so that the impedance elements are adopted for absorbing the energy of the electromagnetic noise to avoid the electromagnetic reflection induced by the electromagnetic noise and interfering the signal transmitted on the transmission line.

It is one object of the present invention to provide an electromagnetic noise filter device and an equivalent filter circuit thereof, in which multiple pair of impedance elements are configured therein so that the multiple pair of impedance elements are adopted for absorbing the electromagnetic noises on multiple different specific frequencies, in such a way the filter device and the equivalent filter circuit may be applied in multiple frequencies transmission scheme.

It is one object of the present invention to provide an electromagnetic noise filter device, wherein a slotted ground structure is configured within the filter device, comprising one or more impedance elements therein, and made into a bended form to reduce the size of the filter device.

To achieve above objects, the present invention provides an electromagnetic noise filter device, comprising: a substrate; at least one transmission line configured on the top surface of the substrate; a ground plane configured on the bottom surface of the substrate and comprising a slotted ground structure, the slotted ground structure comprising: a reference metal plane; and a slotted portion surrounded the reference metal plane; and a pair or multi pair of impedance elements connected between the reference metal plane and the ground plane, wherein each pair of impedance elements are symmetrically provided on right and left sides of the transmission line on the basis of the transmission line as the center.

In one embodiment of the present invention, wherein the impedance elements are resistors, capacitors or inductors.

In one embodiment of the present invention, wherein the slotted portion comprises a pair of bended slotted segments symmetrically provided on right and left sides of the transmission line on the basis of the transmission line as the center.

In one embodiment of the present invention, wherein the transmission line comprises a bended transmission segment.

In one embodiment of the present invention, wherein the bended transmission segment of the transmission line is configured with respect to the position of the reference metal plane.

In one embodiment of the present invention, the number of the transmission lines is two to form a pair of differential transmission lines.

The present invention further provides an equivalent filter circuit formed by an electromagnetic coupling generated on an electromagnetic noise filter device, comprising: a first equivalent transmission line model, comprising: a first main transmission line, connected at one port thereof to a signal inputted terminal and connected at the other port thereof to a signal outputted terminal; and a first sub transmission line; a second equivalent transmission line model, comprising: a second main transmission line, connected at one port thereof to ground; and a second sub transmission line, connected at one port thereof to one port of the first sub transmission line; and a third equivalent transmission line model, comprising: a third main transmission line, wherein the other port of the second main transmission line is grounded via the third main transmission line; and a third sub transmission line, wherein the other port of the second sub transmission line is connected to the other port of the first sub transmission line via the third sub transmission line; wherein an impedance element is paralleled between the second equivalent transmission line model and the third equivalent transmission line model.

In one embodiment of the present invention, wherein a first characteristic impedance and a first electrical length are coupling generated between the first main transmission line and the first sub transmission line, a second characteristic impedance and a second electrical length are coupling generated between the second main transmission line and the second sub transmission line, and a third characteristic impedance and a third electrical length are coupling generated between the third main transmission line and the third sub transmission line.

In one embodiment of the present invention, wherein the first characteristic impedance, the second characteristic impedance and the third characteristic impedance are of the same impedance value or the different impedance value, and the first electrical length, the second electrical length and the third electrical length are of the same electrical length or the different electrical length.

In one embodiment of the present invention, wherein the third equivalent transmission line model is connected to at least one fourth equivalent transmission line model in series, the fourth equivalent transmission line model comprises a fourth main transmission line and a fourth sub transmission line, the other port of the second main transmission line is grounded via the third main transmission line and the fourth main transmission line in series, the other port of the second sub transmission line is connected to the other port of the first sub transmission line via the third sub transmission line and the fourth sub transmission line in series.

In one embodiment of the present invention, wherein there is another impedance element paralleled between the third equivalent transmission line model and the fourth equivalent transmission line model.

In one embodiment of the present invention, wherein there is another impedance element paralleled between the fourth equivalent transmission line model and the other fourth equivalent transmission line model.

In one embodiment of the present invention, wherein a first characteristic impedance and a first electrical length are coupling generated between the first main transmission line and the first sub transmission line, a second characteristic impedance and a second electrical length are coupling generated between the second main transmission line and the second sub transmission line, a third characteristic impedance and a third electrical length are coupling generated between the third main transmission line and the third sub transmission line, and a fourth characteristic impedance and a fourth electrical length are coupling generated between the fourth main transmission line and the fourth sub transmission line.

In one embodiment of the present invention, wherein the first characteristic impedance, the second characteristic impedance, the third characteristic impedance and the fourth characteristic impedance are of the same impedance value or the different impedance value, and the first electrical length, the second electrical length, the third electrical length and the fourth electrical length are of the same electrical length or the different electrical length.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which.

DETAILED DESCRIPTION OF THE PREFERRED EMBODIMENTS

Figure 1:
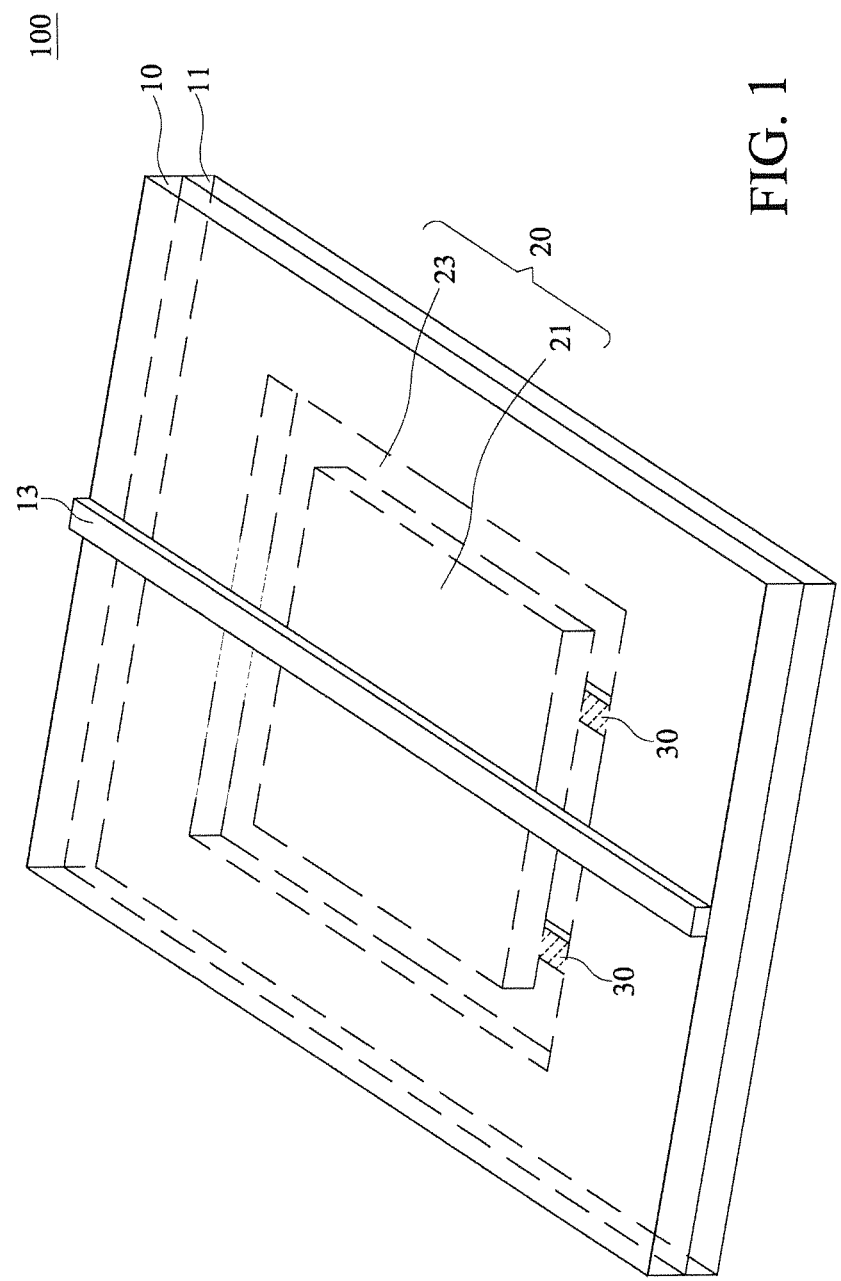
FIG. 1 is a three-dimensional structural view of an electromagnetic noise filter device according to one embodiment of the present invention.
Figure 2:
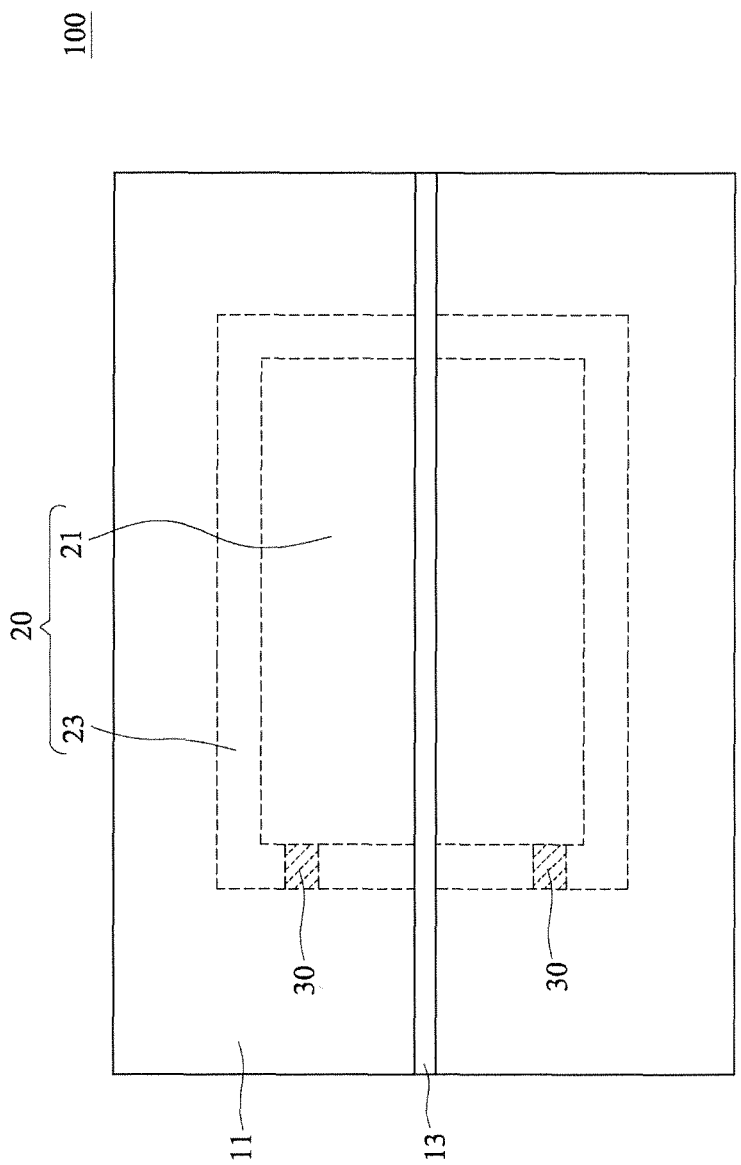
FIG. 2 is a structural perspective top view of an electromagnetic noise filter device according to one embodiment of the present invention.
Figure 3:
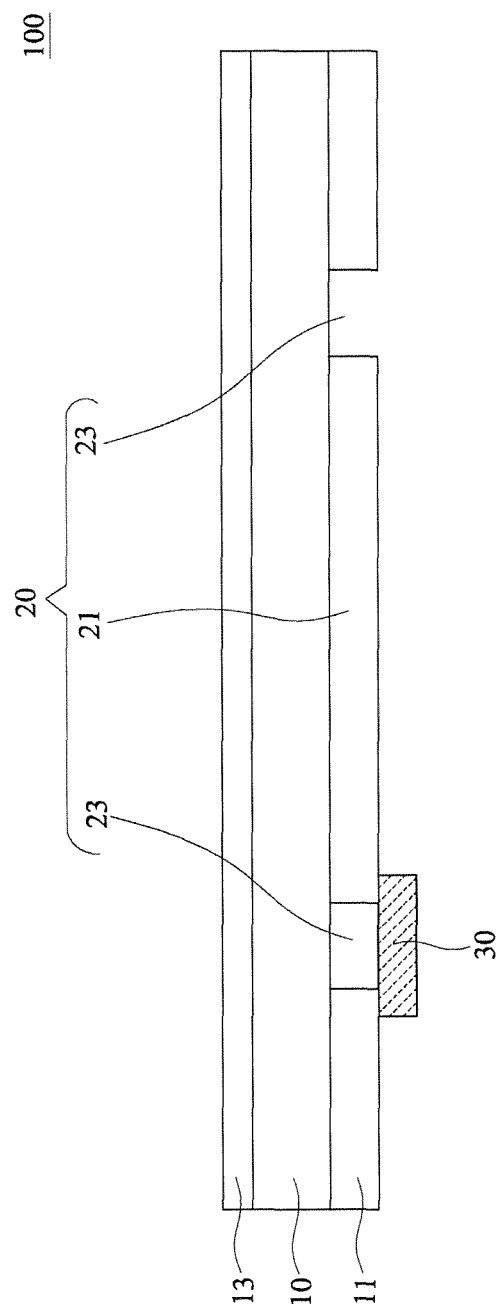
FIG. 3 is a structural cross-sectional view of an electromagnetic noise filter device according to one embodiment of the present invention.

Referring to FIGS. 1, 2 and 3, there are shown a three-dimensional structural view, a structural perspective top view and a structural cross-sectional view of an electromagnetic noise filter device according to one embodiment of the present invention. As illustrated in those figures, the filter device 100 comprises a substrate 10, a ground plane 11 and a transmission line 13.

Wherein the transmission line 13 is configured on the top surface of the substrate 10 in the form of a strip line, a micro strip line or an embedded micro strip line. The ground plane 11 is a metal junction plane and configured on the bottom surface of the substrate 10. The ground plane 11 is etched so as to form a slotted ground structure 20.

The slotted ground structure 20 comprises a reference metal plane 21 and a slotted portion 23. The slotted portion 23 surrounds the reference metal plane 21. The transmission line 13 may be allowed to pass above the slotted ground structure 20. The slotted ground structure 20 is symmetrically provided on right and left sides of the transmission line 13 on the basis of the transmission line 13 as the center. The transmission line 13 is electromagnetic coupled to the reference metal plane 21 and the ground plane 11, while the reference metal plane 21 is electromagnetic coupled to the ground plane 11.

A pair of impedance elements 30 is configured within the slotted portion 23. The reference metal plane 21 is electrically connected to the ground plane 11 via the impedance elements 30. The impedance elements 30 are resistors, capacitors or inductors. In one embodiment of the present invention, the pair of impedance elements 30 are also symmetrically provided on right and left sides of the transmission line 13 on the basis of the transmission line 13 as the center.

In the present invention, the transmission line 13 can be electromagnetic coupled to the slotted ground structure 20 and the impedance elements 30 so as to form a filter circuit. When the signal transmitted on the transmission line 13, the impedance elements 30 adopted by the filter circuit will for absorbing the electromagnetic noises and transfering the electromagnetic noises into heat emitted into the air. Thereby, the electromagnetic noise will be absorbed by the filter circuit so as to avoid interfering the signal transmitted on the transmission line 13. Besides, the detail circuit structure of the filter circuit of the present invention is disclosed in later.

Figure 4:
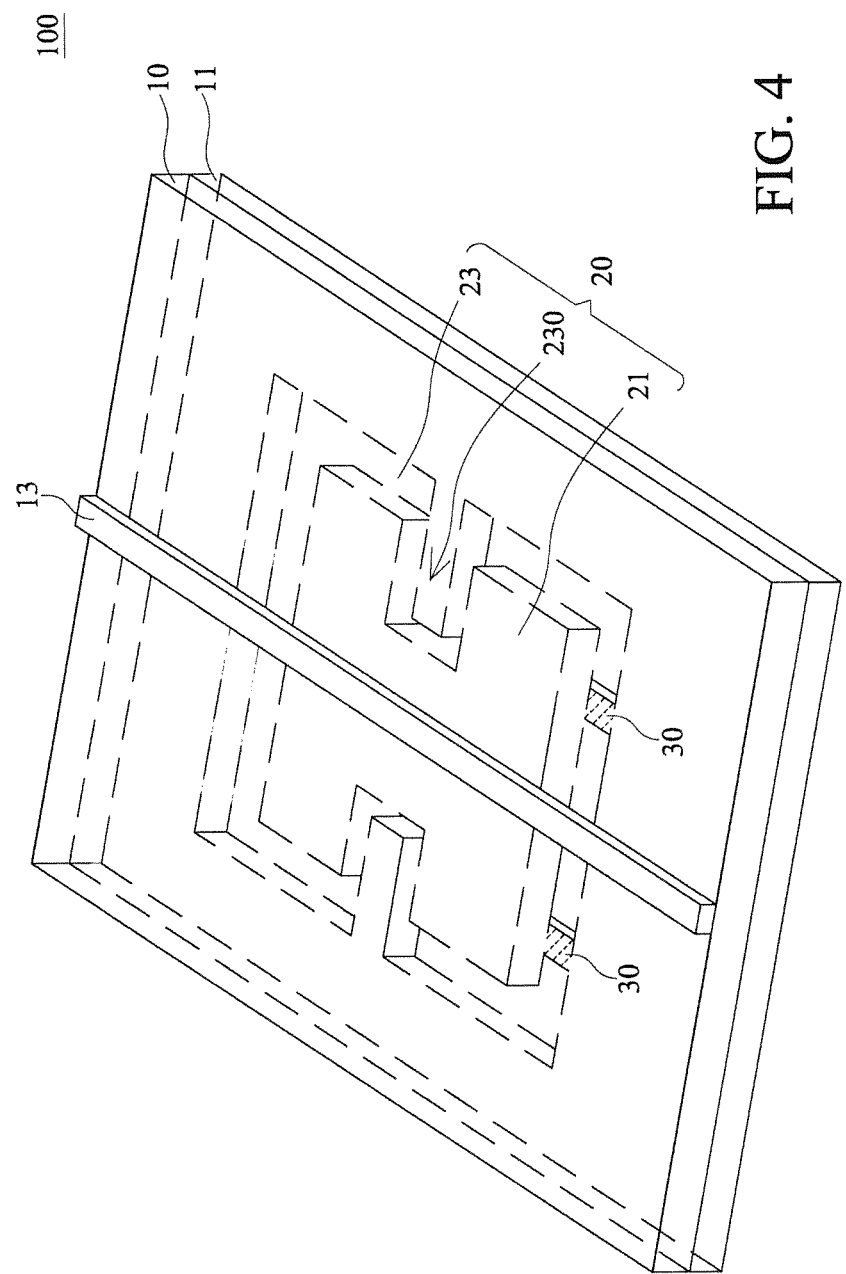
FIG. 4 is a three-dimensional structural view of an electromagnetic noise filter device according to another embodiment of the present invention.
Figure 5:
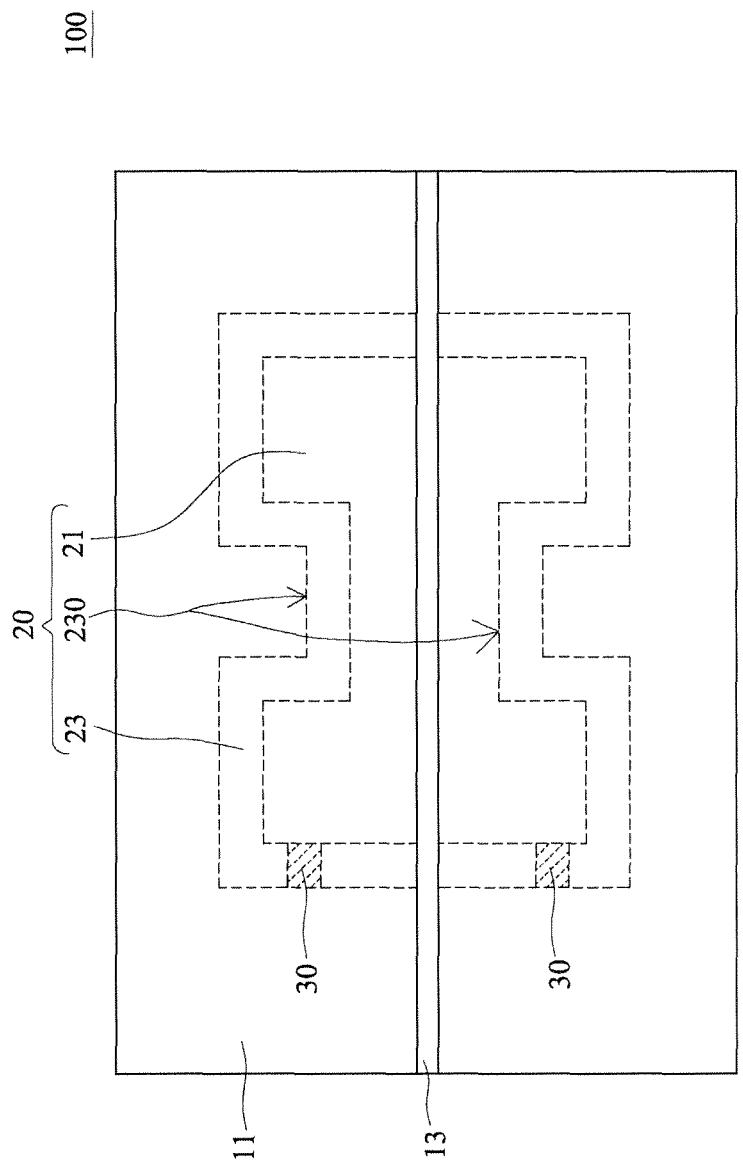
FIG. 5 is a structural perspective top view of an electromagnetic noise filter device according to another embodiment of the present invention.

Referring FIGS. 4 and 5, in one embodiment of the present invention, parts of slotted segments of the slotted portion 23 can be made into a bended form to reduce the size of the filter device 100, for example, a pair of bended slotted segments 230. The pair of bended slotted segments 230 are symmetrically provided on right and left sides of the transmission line 13 on the basis of the transmission line 13 as the center.

Figure 6:
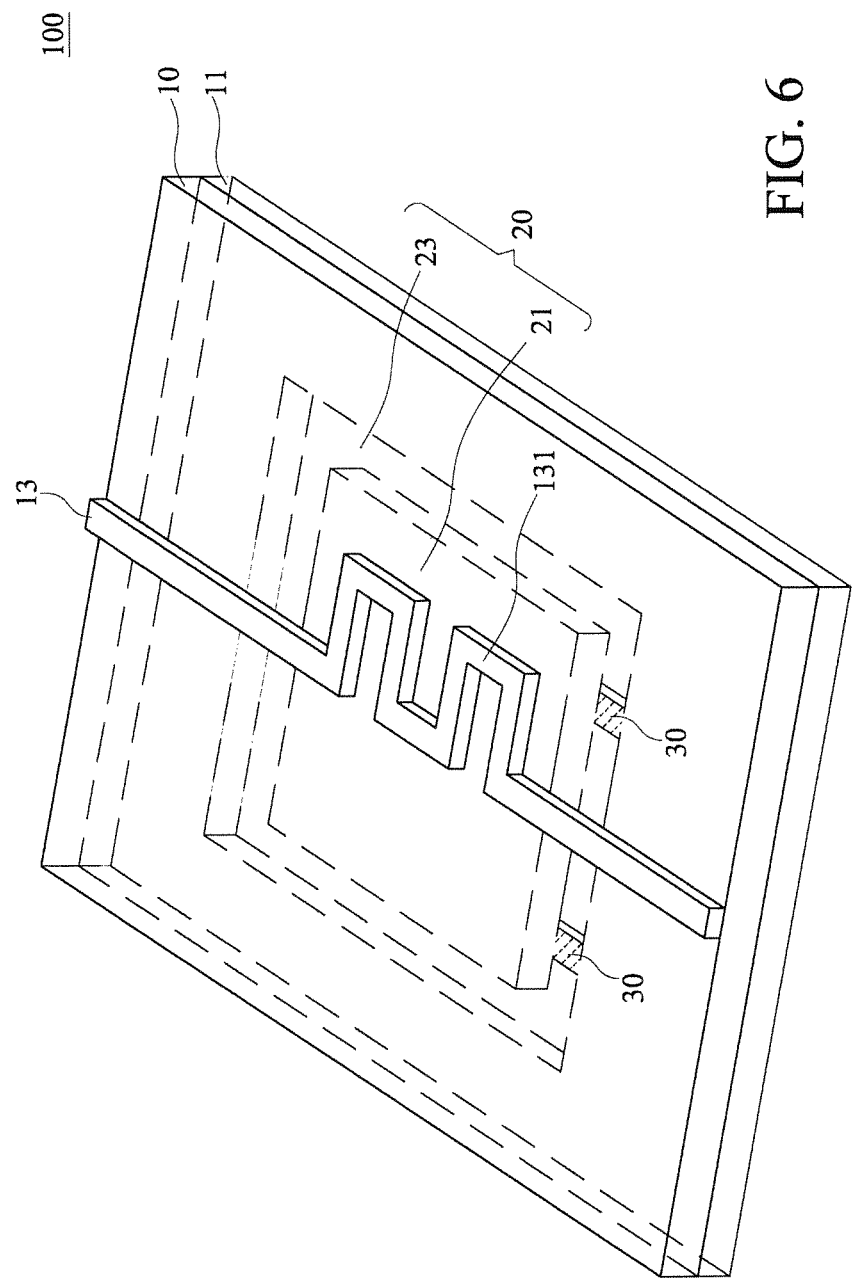
FIG. 6 is a three-dimensional structural view of an electromagnetic noise filter device according to another embodiment of the present invention.
Figure 7:
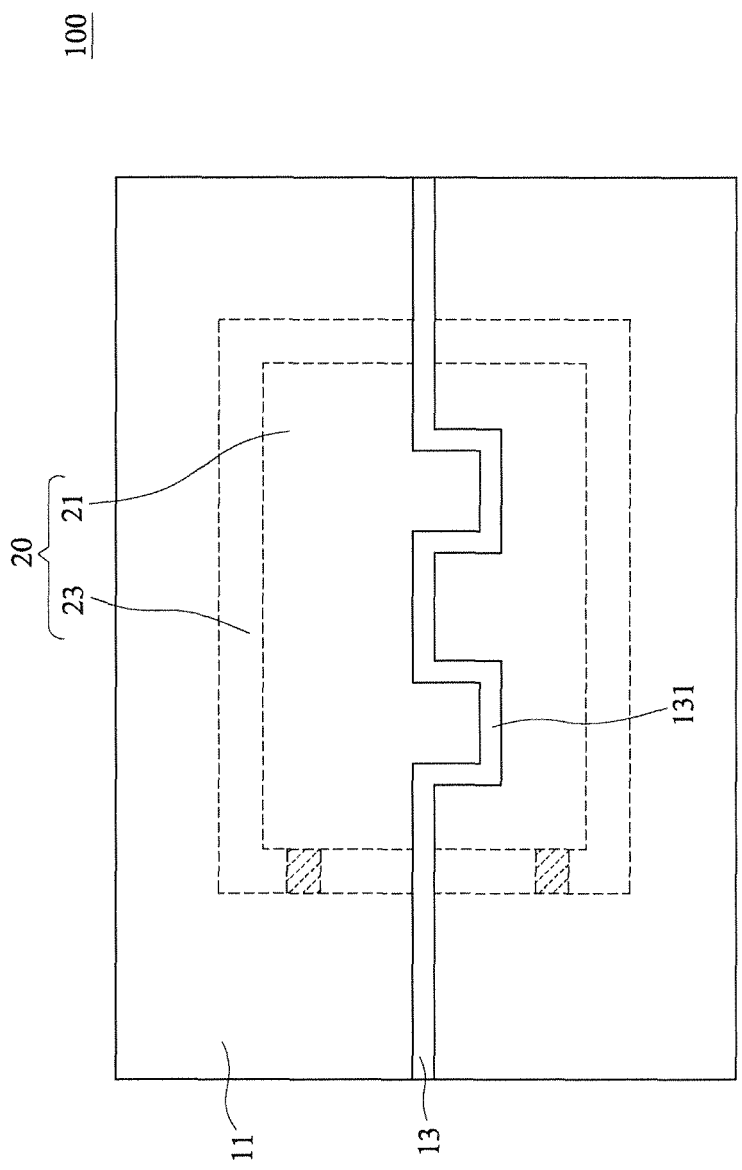
FIG. 7 is a structural perspective top view of an electromagnetic noise filter device according to another embodiment of the present invention.

Referring FIGS. 6 and 7, in other embodiment of the present invention, parts of transmission segment of the transmission line 13 can be made into a bended form, for example, a bended transmission segment 131, in such a way the object of the size reduction of the filter device can be also achieved. Otherwise, in another embodiment of the present invention, parts of slotted segments of the slotted portion 23 and parts of transmission segment of the transmission line 13 are simultaneously made into the bended form so that the size of the filter device 100 may be reduced to a smaller size.

Figure 8:
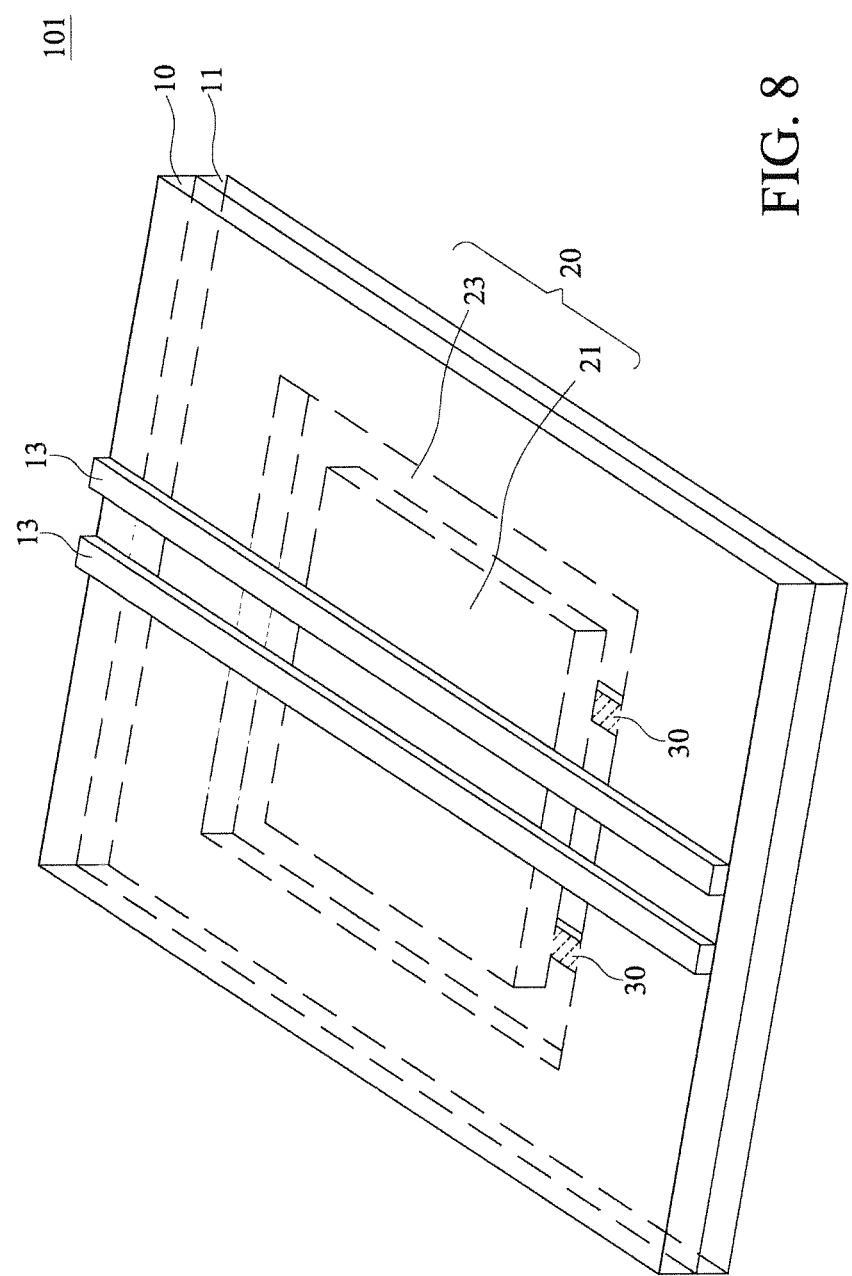
FIG. 8 is a three-dimensional structural view of an electromagnetic noise filter device according to another embodiment of the present invention.
Figure 9:
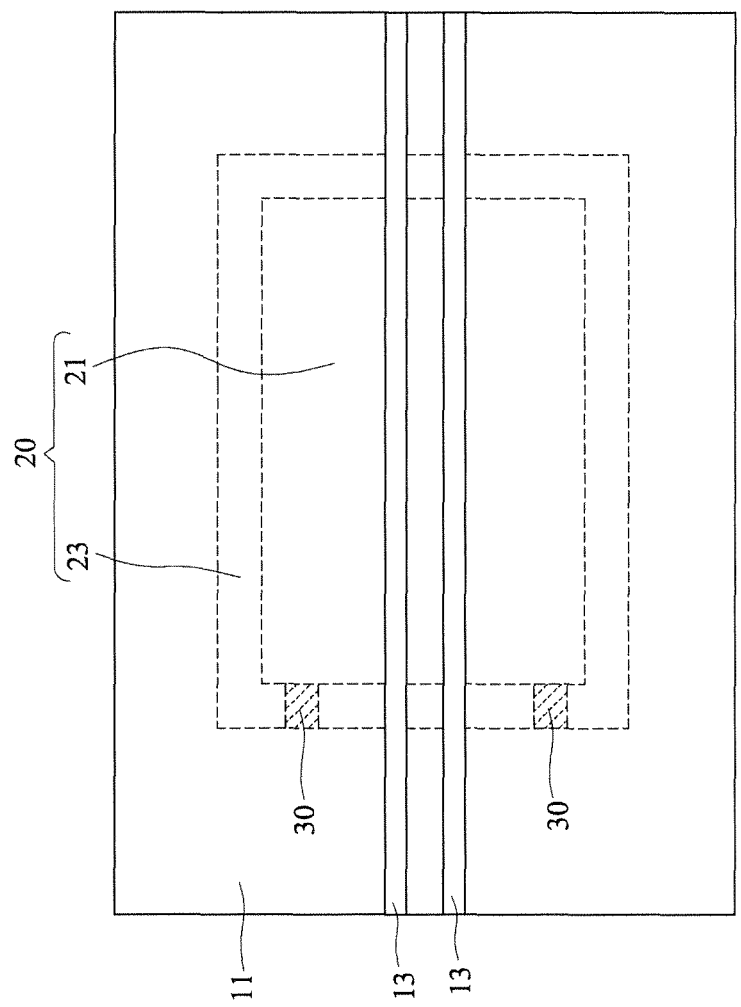
FIG. 9 is a structural perspective top view of an electromagnetic noise filter device according to another embodiment of the present invention.

Referring to FIGS. 8 and 9, there are shown a three-dimensional structural view and a structural perspective top view of an electromagnetic noise filter device according to another embodiment of the present invention. In the embodiment, the member of the transmission line 13 of the filter device 101 is two to form a pair of differential transmission lines. When the filter device 101 is used for transmitting the signal, a differential signal and a common signal will be generated on the two transmission lines 13. The differential signal is a data signal, and the common signal is a common noise. The filter device 101 may be used to absorb the common noise to avoid the electromagnetic noise interfering the quality of transmission of the differential signal.

Figure 10:
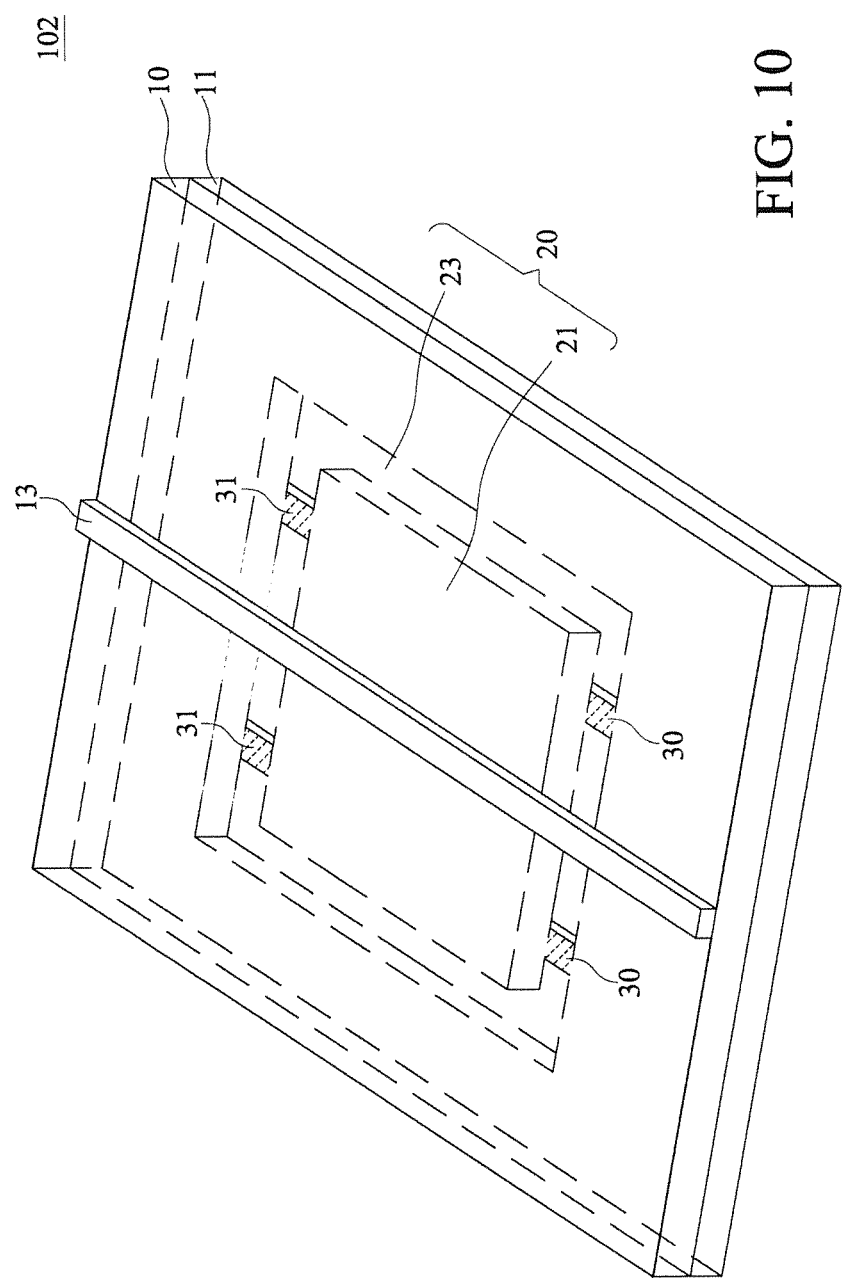
FIG. 10 is a three-dimensional structural view of an electromagnetic noise filter device according to another embodiment of the present invention.
Figure 11:
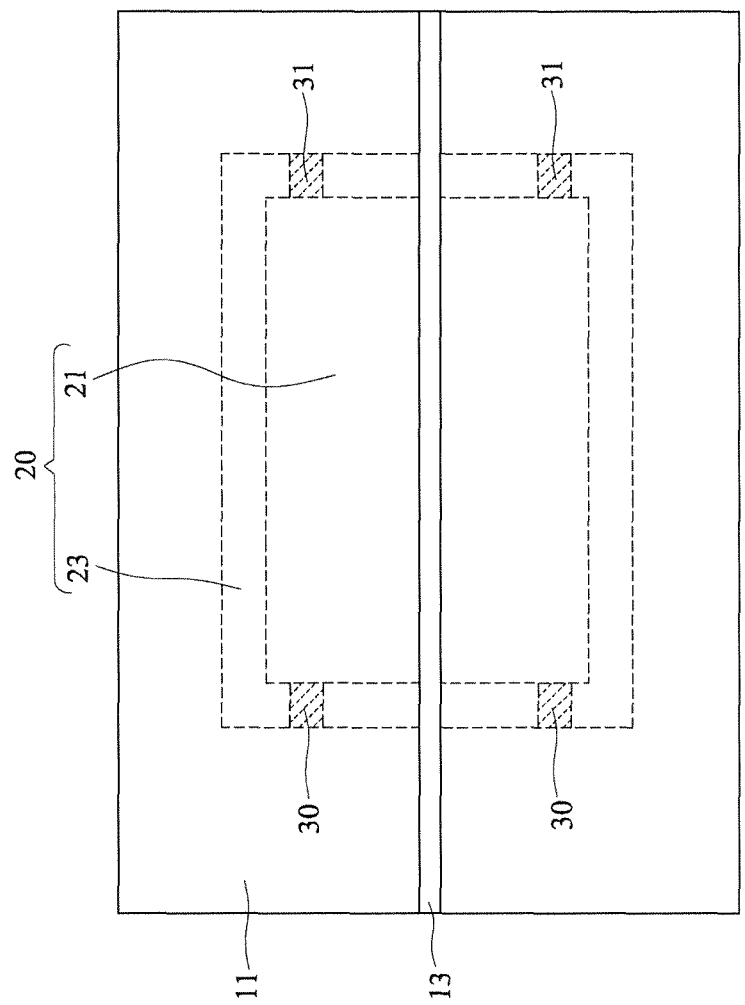
FIG. 11 is a structural perspective top view of an electromagnetic noise filter device according to another embodiment of the present invention.
Figure 12:
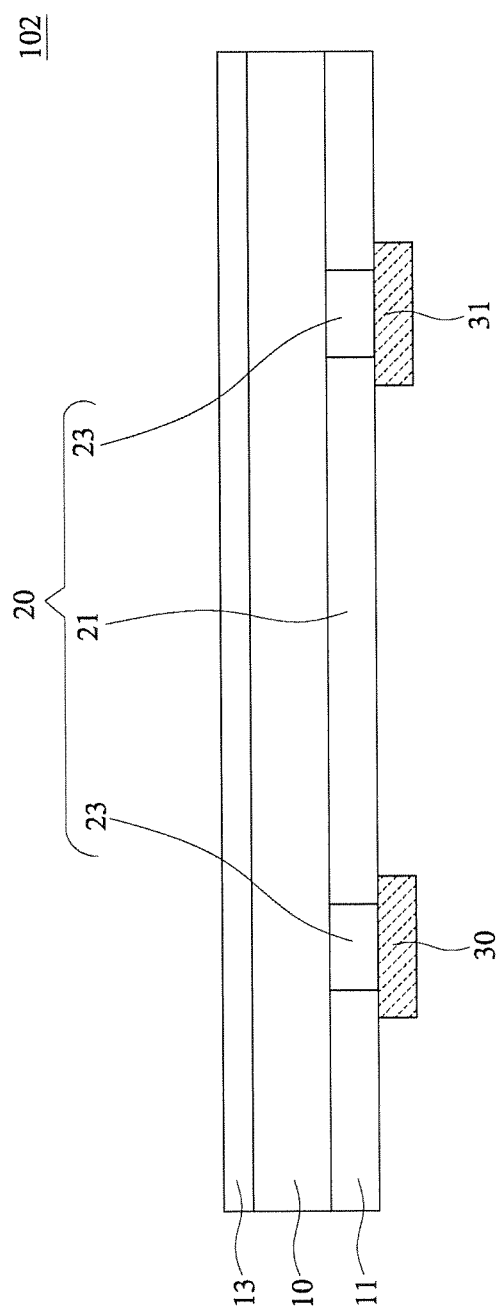
FIG. 12 is a structural cross-sectional view of an electromagnetic noise filter device according to another embodiment of the present invention.

Referring to FIGS. 10, 11 and 12, there are shown a three-dimensional structural view, a structural perspective top view and a structural cross-sectional view of an electromagnetic noise filter device according to one embodiment of the present invention. As illustrated in those figures, the filter device 102 of the embodiment may be allowed to configure multiple pairs of impedance elements 30, 31 within the slotted ground structure 20. The reference metal plane 21 is connected to the ground plane 11 via each pair of impedance elements 30, 31. Similarly, each pair of impedance elements 30, 31 are also symmetrically provided on right and left sides of the transmission line 13 on the basis of the transmission line 13 as the center. Of course, the slotted ground structure 20 having multiple pair of impedance elements 30, 31 can be also implemented in the filter device 102 illustrated in FIGS. 8 and 9.

Figure 13:
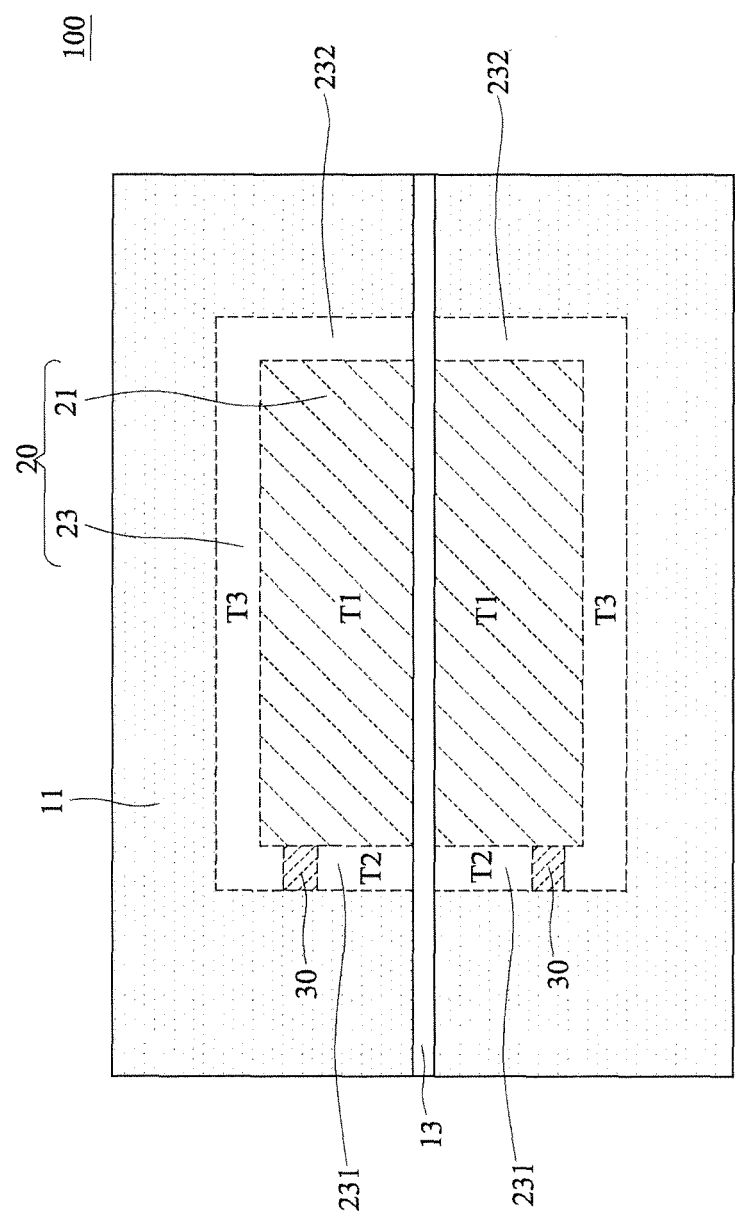
FIG. 13 is a structural perspective top view of equivalent transmission line models of an electromagnetic noise filter device according to one embodiment of the present invention.
Figure 14:
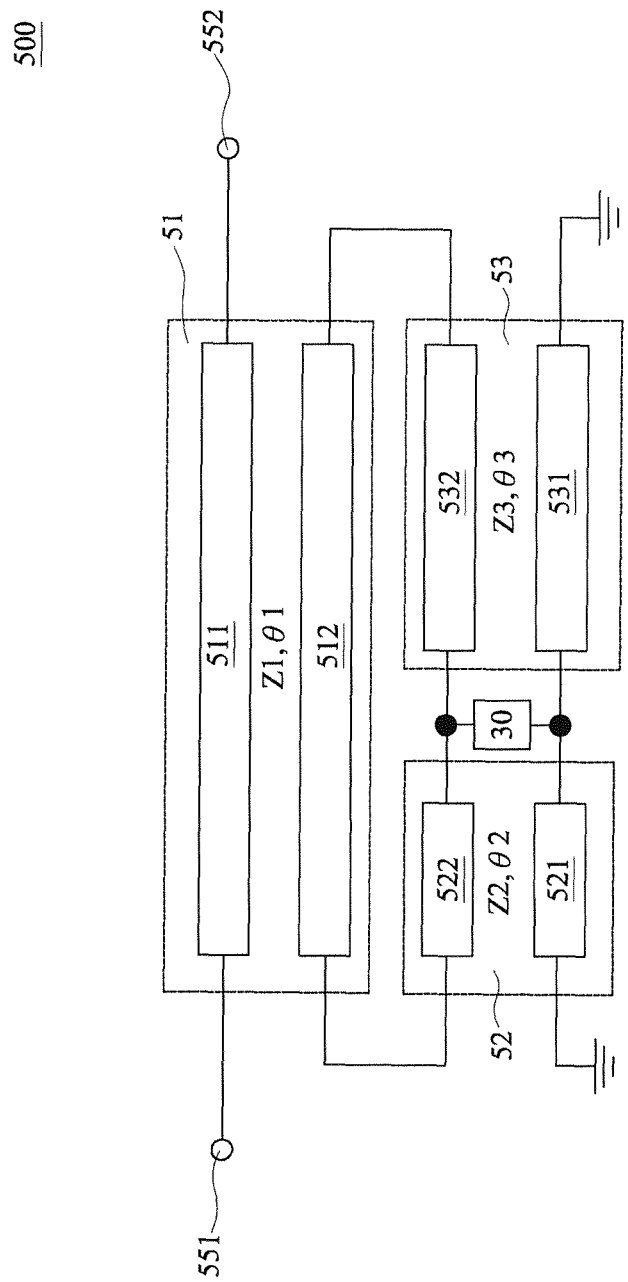
FIG. 14 is a diagram of circuit structure of an equivalent filter circuit according to one embodiment of the present invention.

Referring to FIGS. 13 and 14, there are shown a structural perspective top view of equivalent transmission line models of an electromagnetic noise filter device and a diagram of circuit structure of an equivalent filter circuit according to one embodiment of the present invention. As illustrated in FIG. 13, a pair of impedance elements 30 is configured within the slotted portion 23. The slotted portion 23 is divided into two first slotted segments 231 and two second slotted segments 232 according to the configuration position of the pair of impedance elements 30. The first slotted segments 231 and the second slotted segments 232 surround the reference metal plane 21, and the reference metal plane 21 is connected to the ground plane 11 in periphery via the pair of impedance elements 30.

Referring to FIG. 14, the equivalent filter circuit 500 comprises a first equivalent transmission line model (T1) 51, a second equivalent transmission line model (T2) 52 and a third equivalent transmission line model (T3) 53. The transmission line 13 is electromagnetic coupled to the reference metal plane 21 so as to generate the first equivalent transmission line model (T1) 51. The reference metal plane 21 is electromagnetic coupled to the ground plane 11 distributed beside the first slotted segments 231 so as to generate the second equivalent transmission line model (T2) 52. The reference metal plane 21 is electromagnetic coupled to the ground plane 11 distributed beside the second slotted segments 232 so as to generate the third equivalent transmission line model (T3) 53.

The first equivalent transmission line model (T1) 51 comprises a first main transmission line 511 and a first sub transmission line 512. The first main transmission line 511 indicating the equivalent element of the transmission line 13, while the first sub transmission line 512 indicating the equivalent element of the reference metal plane 21. The second equivalent transmission line model (T2) 52 comprises a second main transmission line 521 and a second sub transmission line 522. The second main transmission line 521 indicating the equivalent element of the ground plane 11, while the second sub transmission line 522 indicating the equivalent element of the reference metal plane 21. The third equivalent transmission line model (T3) 53 comprises a third main transmission line 531 and a third sub transmission line 532. The third main transmission line 531 indicating the equivalent element of the ground plane 11, while the third sub transmission line 532 indicating the equivalent element of the reference metal plane 21.

In the first equivalent transmission line model (T1) 51, one port of the first main transmission line 511 is connected to a signal-inputted terminal 551, while the other port of the first main transmission line 511 is connected to a signal-outputted terminal 552. In the second equivalent transmission line model (T2) 52 and the third equivalent transmission line model (T3) 53, one port of the second main transmission line 521 is grounded directly, while the other port of the second main transmission line 521 is grounded via serial connection to the corresponding third main transmission line 531. One port of the second sub transmission line 522 is connected to one port of the first sub transmission line 512, while the other port of the second sub transmission line 522 is connected to the other port of the first sub transmission line 512 via serial connection to the corresponding third sub transmission line 532. As such, the second sub transmission line 522 and together with the corresponding serial third sub transmission line 532 may be connected to the first sub transmission line 512 in parallel.

Furthermore, the equivalent filter circuit 500 further comprises the pair of impedance elements 30. Each impedance element 30 is configured between the corresponding second equivalent transmission line model (T2) 52 and the corresponding third equivalent transmission line model (T3) 53, and connected with the corresponding second equivalent transmission line model (T2) 52 and the corresponding third equivalent transmission line model (T3) 53 in parallel.

According to the law of conservation of energy, the energy of electromagnetic noises should comply with the following equation (1):

$$1 = |S_{11}|^2 + |S_{21}|^2 + \delta_R + \delta_L. \quad (1)$$

where $|S_{11}|$ refers to the return loss of the electromagnetic noises inputted to the signal inputted terminal 551; $|S_{21}|$ refers to the insertion loss of the electromagnetic noises transmitted from the signal inputted terminal 551 to the signal outputted terminal 552; $\delta_R$ refers to the radiation with respect to the electromagnetic noises, while $\delta_L$ refers to the loss with respect to the electromagnetic noises.

Ideally, the radiation amount of $\delta_R$ is very small, so that the above equation (1) can be simplified as equation (2):

$$1 = |S_{11}|^2 + |S_{21}|^2 + \delta_L \quad (2)$$

In the past, the loss of $\delta_L$ caused the metal wire and material substrate is negligible in a conventional electromagnetic noise filter circuit. Therefore, if the electromagnetic noises within a specific suppression frequency band can be fully returned, $|S_{11}|$ must be close to 1 and $|S_{21}|$ must be close to 0. However, the returned the electromagnetic noises may be electromagnetic coupled to the other device, which result causing the electromagnetic radiation generated again, and therefore interfering the radio frequency of the circuit or the operation of the antenna.

For the reason, when the electromagnetic noises enter the equivalent filter circuit 500, the impedance elements 30 configured within the equivalent filter circuit 500 will be for absorbing the electromagnetic noises and transferring the electromagnetic noises into heat emitted into the air so that the loss of $\delta_L$ may be increase substantially and the return of $|S_{11}|$ may, be decrease substantially.

Figure 15:
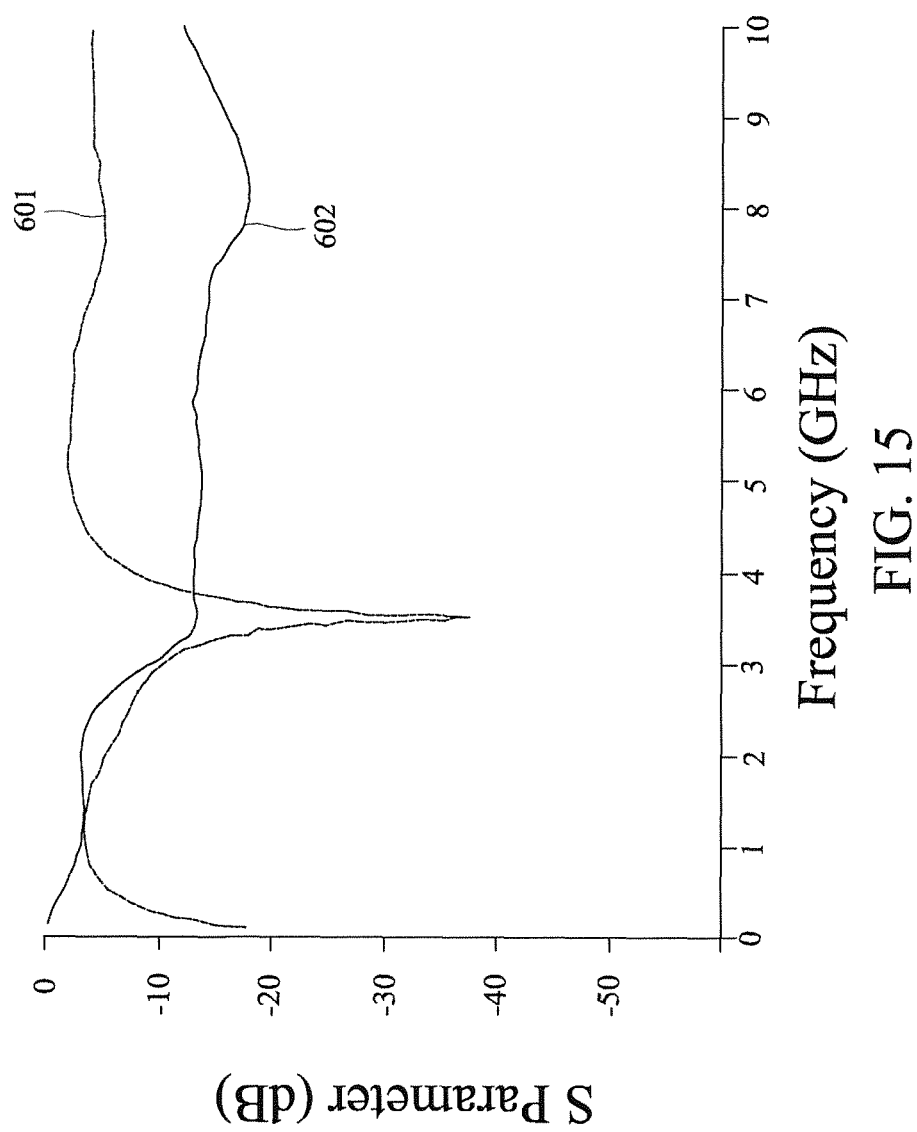
FIG. 15 is an oscillogram of measuring the electromagnetic noises generated on the filter device illustrated in FIG. 14 of the present invention.
Figure 16:
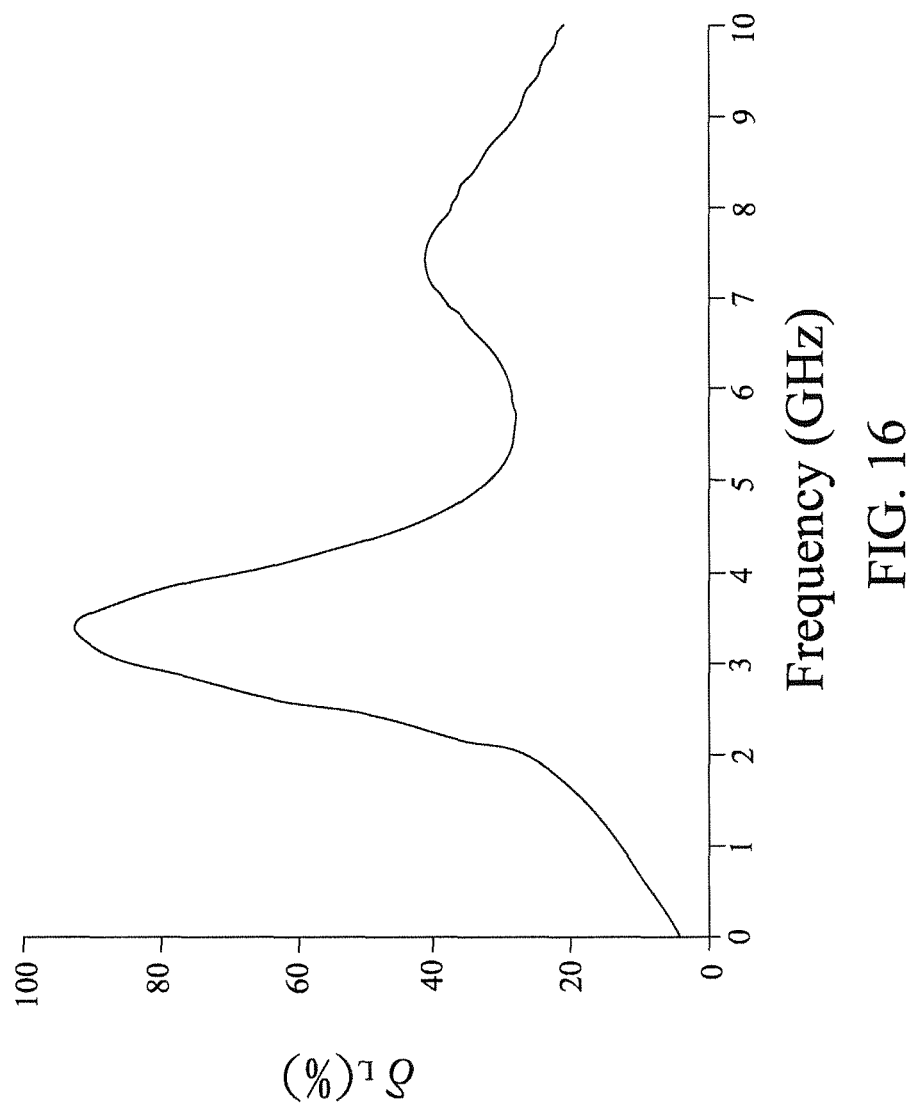
FIG. 16 is an oscillogram of absorbing the electromagnetic noises generated on the filter device illustrated in FIG. 14 of the present invention.

Referring to FIGS. 15 and 16, there are shown an oscillogram of measuring the electromagnetic noises and an oscillogram of absorbing the electromagnetic noises generated on the filter device illustrated in FIG. 14 of the present invention, respectively. As illustrated in FIG. 15, a return loss $|S_{11}|$ curve 601 and an insertion loss $|S_{21}|$ curve 602 are obtained by the measurement of electromagnetic noises.

With respect to the electromagnetic noises, it is generally to use −10 dB as the basis for return loss $|S_{11}|$ and insertion loss $|S_{21}|$ below −10 dB indicating an effectively suppressed the electromagnetic noises. Taking the present invention as an example, the return loss $|S_{11}|$ on the curve 601 in the frequency 3.5 GHz is situated below −10 dB, while the insertion loss $|S_{21}|$ on the curve 602 over the frequency 3 GHz is situated below −10 dB.

Referring to FIG. 16, the energy of electromagnetic noises for more than 90% can be absorbed when the equivalent filter circuit 500 of the present invention is operating in frequency 3.5 GHz. As such, the equivalent filter circuit 500 operating in a specific frequency is able to acquire the result of better absorption and suppression for the electromagnetic noises so as to avoid the electromagnetic noises reflection and improve the quality of signal transmission.

Referring to FIGS. 13 and 14 once again, in the first equivalent transmission line model (T1) 51, a first characteristic impedance Z1 and a first electrical length θ1 are coupling generated between the first main transmission line 511 and the first sub transmission line 512. In the second equivalent transmission line model (T2) 52, a second characteristic impedance Z2 and a second electrical length θ2 are coupling generated between the second main transmission line 521 and the second sub transmission line 522. In the third equivalent transmission line model (T3) 53, a third characteristic impedance Z3 and a third electrical length θ3 are coupling generated between the third main transmission line 531 and the third sub transmission line 532. Each of characteristic impedance Z1, Z2, Z3 is design as the same impedance value or the different impedance value, while each of electrical length θ1, θ2, θ3 is design as the same electrical length or the different electrical length. In the present invention. Each of characteristic impedance Z1, Z2, Z3 and/or each of electrical length θ1, θ2, θ3 can be amended by changing the configuration position of the impedance elements 30 within the slotted portion 23, in such a way the frequency of absorption electromagnetic noises of the equivalent filter circuit 500 can be adjusted.

Figure 17:
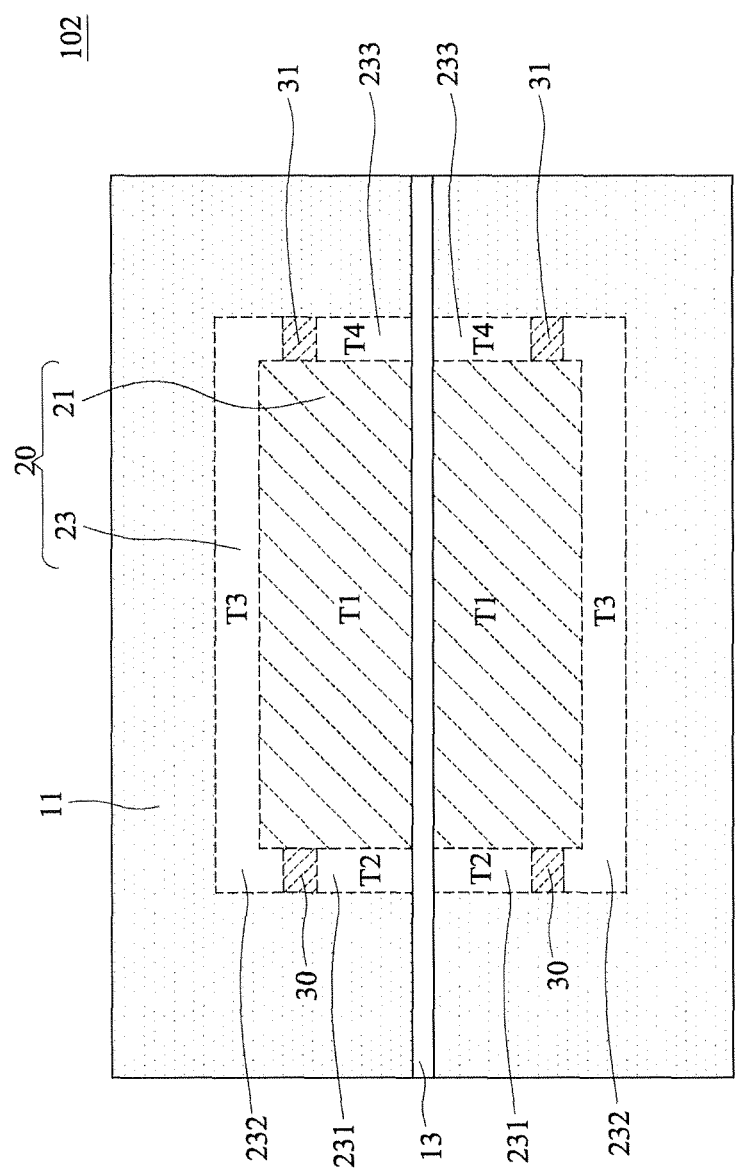
FIG. 17 is a structural perspective top view of equivalent transmission line models of an electromagnetic noise filter device according to another embodiment of the present invention.
Figure 18:
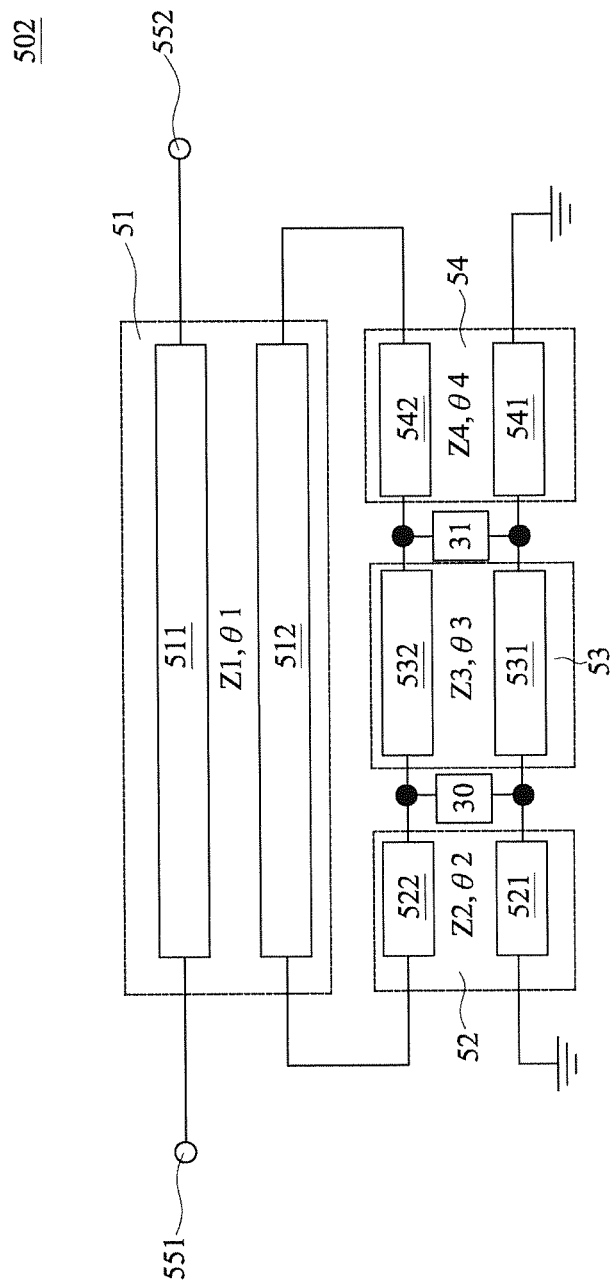
FIG. 18 is a diagram of circuit structure of an equivalent filter circuit according to another embodiment of the present invention.

Referring to FIGS. 17 and 18, there are shown a structural perspective top view of equivalent transmission line models of an electromagnetic noise filter device and a diagram of circuit structure of an equivalent filter circuit according to another embodiment of the present invention. Compared to the filter device 100 and the equivalent filter circuit 500 of the above embodiment merely configured with a pair of impedance elements 30, the filter device 102 and the equivalent filter circuit 502 of the present embodiment may be configured with at least two pairs of impedance elements 30, 31.

As illustrated in FIG. 17, two pairs of impedance elements 30, 31 are configured in the appropriate positions of the slotted portion 23, respectively, for example, two pairs of impedance elements 30, 31 are configured in the slotted segments beside the transmission line 13. The slotted portion 23 is divided into two first slotted segments 231, two second slotted segments 232 and two third slotted segments 233 according to the configuration positions of two pairs of impedance elements 30, 31. The first slotted segments 231, the second slotted segments 232 and the third slotted segments 233 surround the reference metal plane 21, and the reference metal plane 21 is connected to the ground plane 11 in periphery via the two pair of impedance elements 30, 31.

Referring to FIG. 18, the equivalent filter circuit 502 comprises a first equivalent transmission line model (T1) 51, a second equivalent transmission line model (T2) 52, a third equivalent transmission line model (T3) 53 and at least one fourth equivalent transmission line model (T4) 54, The transmission line 13 is electromagnetic coupled to the reference metal plane 21 so as to generate the first equivalent transmission line model (T1) 51. The reference metal plane 21 is electromagnetic coupled to the ground plane 11 distributed beside the first slotted segments 231 no as to generate the second equivalent transmission line model (T2) 52. The reference metal plane 21 is electromagnetic coupled to the ground plane 11 distributed beside the second slotted segments 232 so as to generate the third equivalent transmission line model (T3) 53. The reference metal plane 21 is electromagnetic coupled to the ground plane 11 distributed beside the third slotted segments 233 so as to generate the fourth equivalent transmission line model (T4) 54.

The first equivalent transmission line model (T1) 51 comprises a first main transmission line 511 and a first sub transmission line 512. The first main transmission line 511 indicating the equivalent element of the transmission line 13, while the first sub transmission line 512 indicating the equivalent element of the reference metal plane 21. The second equivalent transmission line model (T2) 52 comprises a second main transmission line 521 and a second sub transmission line 522. The second main transmission line 521 indicating the equivalent element of the ground plane 11, while the second sub transmission line 522 indicating the equivalent element of the reference metal plane 21. The third equivalent transmission line model (T3) 53 comprises a third main transmission line 531 and a third sub transmission line 532. The third main transmission line 531 indicating the equivalent element of the ground plane 11, while the third sub transmission line 532 indicating the equivalent element of the reference metal plane 21. The fourth equivalent transmission line model (T4) 54 comprises a fourth main transmission line 531 and a third sub transmission line 532. The third main transmission line 541 indicating the equivalent element of the ground plane 11, while the fourth sub transmission line 542 indicating the equivalent element of the reference metal plane 21.

In the first equivalent transmission line model (T1) 51, one port of the first main transmission line 511 is connected to a signal-inputted terminal 551, while the other port of the first main transmission line 511 is connected to a signal-outputted terminal 552. In the second equivalent transmission line model (T2) 52, the third equivalent transmission line model (T3) 53 and the fourth equivalent transmission line model (T4) 54, one port of the second main transmission line 521 is grounded directly, while the other port of the second main transmission line 521 is grounded via serial connection to the corresponding third main transmission line 531 and the corresponding fourth main transmission line 541. One port of the second sub transmission line 522 is connected to one port of the first sub transmission line 512, while the other port of the second sub transmission line 522 is connected to the other port of the first sub transmission line 512 via serial connection to the corresponding third sub transmission line 532 and the corresponding fourth sub transmission line 542. As such, the second sub transmission line 522 and together with the corresponding serial third sub transmission line 532 and fourth sub transmission line 542 may be connected to the first sub transmission line 512 in parallel.

Besides, the equivalent filter circuit 502 further comprises at least two pairs of impedance elements 30, 31. One pair of impedance elements 30 are configured between the corresponding second equivalent transmission line model (T2) 52 and the corresponding third equivalent transmission line model (T3) 53, and connected with the corresponding second equivalent transmission line model (T2) 52 and the corresponding third equivalent transmission line model (T3) 53 in parallel. The other pair of impedance elements 31 are configured between the corresponding third equivalent transmission line model (T3) 53 and the corresponding fourth equivalent transmission line model (T4) 54, and connected with the corresponding third equivalent transmission line model (T3) 53 and the corresponding fourth equivalent transmission line model (T4) 54 in parallel. Otherwise, in another embodiment of the present invention, the third equivalent transmission line model (T3) 53 may be connected to multiple fourth equivalent transmission line models (T4) 54 in serial, and another pair of impedance elements 31 are connected with the fourth equivalent transmission line model (T4) 54 and another fourth equivalent transmission line model (T4) 54 in parallel.

Figure 19:
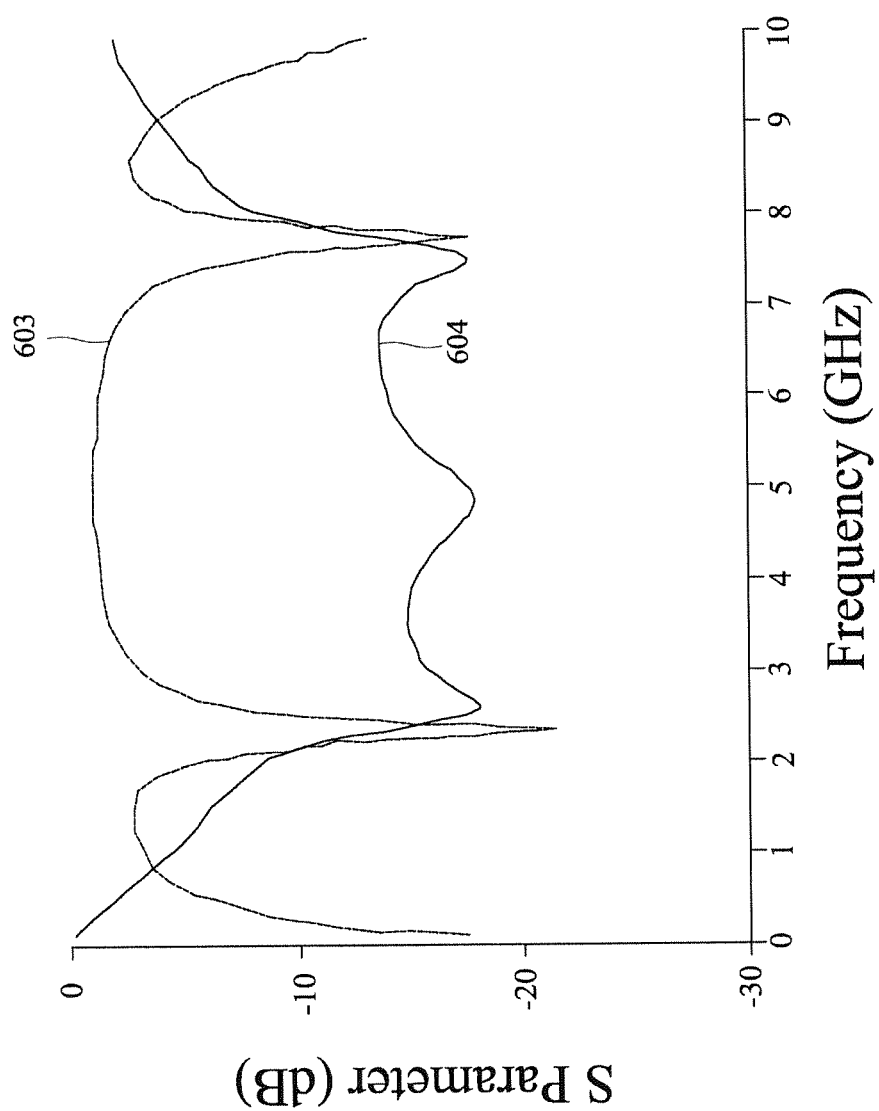
FIG. 19 is an oscillogram of measuring the electromagnetic noises generated on the filter device illustrated in FIG. 18 of the present invention.
Figure 20:
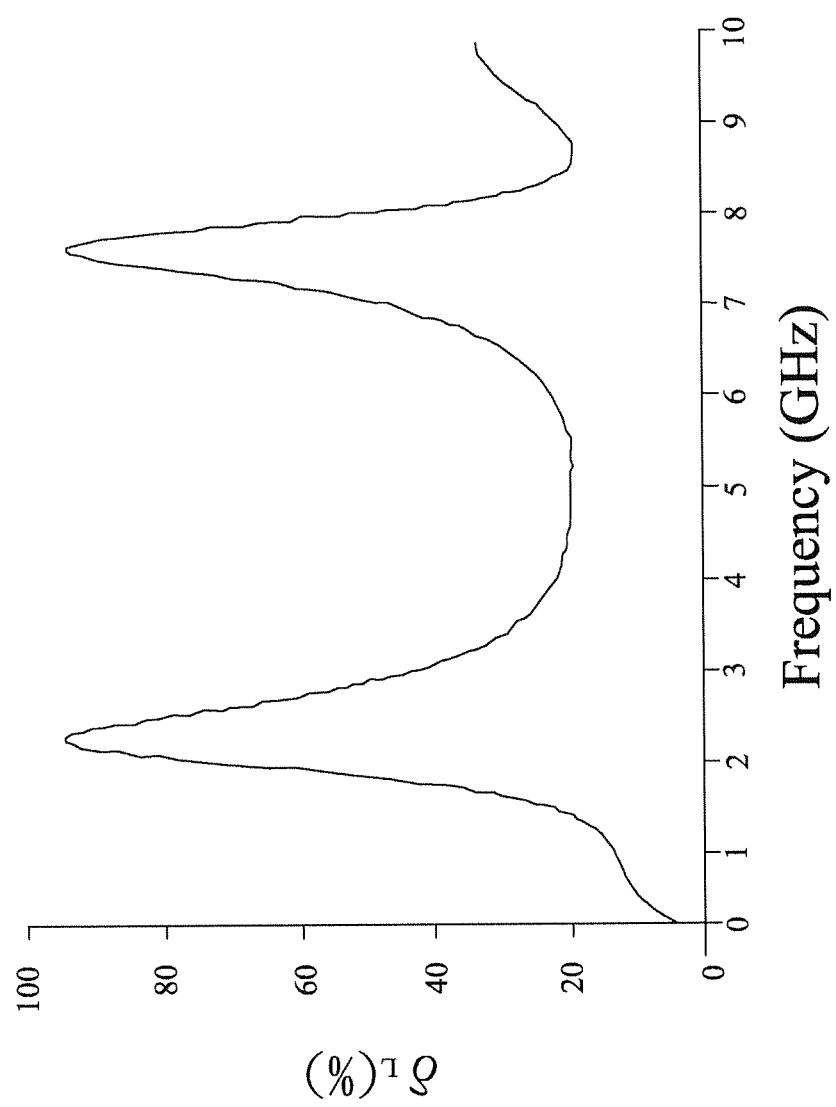
FIG. 20 is an oscillogram of absorbing the electromagnetic noises generated on the filter device illustrated in FIG. 18 of the present invention.

Referring to FIGS. 19 and 20, there are shown an oscillogram of measuring the electromagnetic noises and an oscillogram of absorbing the electromagnetic noises generated on the filter device illustrated in FIG. 18 of the present invention, respectively. As illustrated in FIG. 19, a return loss $|S_{11}|$ curve 603 and an insertion loss $|S_{21}|$ curve 604 are obtained by the measurement of electromagnetic noises.

The return loss $|S_{11}|$ on the curve 603 in the frequency 2.5 GHz or 7.8 GHz is situated below −10 dB, while the insertion loss $|S_{21}|$ on the curve 604 within the frequency band between 2.8 GHz and 7.8 GHz is situated below −10 dB.

Referring to FIG. 20, the energy of electromagnetic noises for more than 90% can be absorbed when the e quivalent filter circuit 502 of the present invention operated in frequency 2.5 GHz or 7.8 GHz. As such, with the configurations of multiple pairs of impedance elements 30, 31, the equivalent filter circuit 502 is allowed to absorb the electromagnetic noises generated on multiple different specific frequencies and thus suitable for multiple frequencies transmission scheme.

Referring to FIGS. 17 and 18 once again, similarly, the first characteristic impedance Z1, the second characteristic impedance Z2 and the third characteristic impedance Z3 as well as the first electrical length θ1, the second electrical length θ2 and the third electrical length θ3 are coupling generated on the first equivalent transmission line models (T1) 51, the second equivalent transmission line models (T2) 52 and the third equivalent transmission line models (T3) 53, respectively. Furthermore, a fourth characteristic impedance Z4 and a fourth electrical length 4 are coupling generated on the fourth equivalent transmission line models (T4) 54. In one embodiment of the present invention, the characteristic impedances Z1, Z2, Z3, Z4 and/or the electrical lengths θ1, θ2, θ3, θ4 can be amended by changing the configuration positions of the impedance elements 30, 31 in the slotted portion 23, in such a way the frequencies of absorption electromagnetic noises of the equivalent filter circuit 502 can be adjusted.

The foregoing description is merely one embodiment of the present invention and not considered as restrictive. All equivalent variations and modifications in shape, structure, feature, and spirit in accordance with the appended claims may be made without in any way from the scope of the invention.

The invention claimed is:

1. An equivalent filter circuit formed by an electromagnetic coupling generated on an electromagnetic noise filter device, comprising:
a first equivalent transmission line model, including:
a first main transmission line, connected at one port thereof to a signal inputted terminal and connected at the other port thereof to a signal outputted terminal; and
a first sub transmission line;
a second equivalent transmission line model, including:
a second main transmission line, connected at one port thereof to ground; and
a second sub transmission line, connected at one port thereof to one port of said first sub transmission line; and
a third equivalent transmission line model, including:

a third main transmission line, wherein the other port of said second main transmission line is grounded via said third main transmission line; and a third sub transmission line, wherein the other port of said second sub transmission line is connected to the other port of said first sub transmission line via said third sub transmission line;

wherein an impedance element is paralleled between said second equivalent transmission line model and said third equivalent transmission line model.

2. The equivalent filter circuit according to claim 1, wherein a first characteristic impedance and a first electrical length are coupling generated between said first main transmission line and said first sub transmission line, a second characteristic impedance and a second electrical length are coupling generated between said second main transmission line and said second sub transmission line, and a third characteristic impedance and a third electrical length are coupling generated between said third main transmission line and said third sub transmission line.

3. The equivalent filter circuit according to claim 2, wherein said first characteristic impedance, said second characteristic impedance and said third characteristic impedance are of the same impedance value or the different impedance value, and said first electrical length, said second electrical length and said third electrical length are of the same electrical length or the different electrical length.

4. The equivalent filter circuit according to claim 1, wherein said third equivalent transmission line model is connected to at least one fourth equivalent transmission line model in series, said fourth equivalent transmission line model includes: a fourth main transmission line and a fourth sub transmission line, the other port of said second main transmission line is grounded via said third main transmission line and said fourth main transmission line in series, the other port of said second sub transmission line is connected to the other port of said first sub transmission line via said third sub transmission line and said fourth sub transmission line in series.

5. The equivalent filter circuit according to claim 4, wherein there is another impedance element paralleled between said third equivalent transmission line model and said fourth equivalent transmission line model.

6. The equivalent filter circuit according to claim 4, further comprising at least one additional fourth equivalent transmission model, wherein another impedance element is disposed in parallel between said fourth equivalent transmission line model and said additional fourth equivalent transmission line model.

7. The equivalent filter circuit according to claim 4, wherein a first characteristic impedance and a first electrical length are coupling generated between said first main transmission line and said first sub transmission line, a second characteristic impedance and a second electrical length are coupling generated between said second main transmission line and said second sub transmission line, a third characteristic impedance and a third electrical length are coupling generated between said third main transmission line and said third sub transmission line, and a fourth characteristic impedance and a fourth electrical length are coupling generated between said fourth main transmission line and said fourth sub transmission line.

8. The equivalent filter circuit according to claim 7, wherein said first characteristic impedance, said second characteristic impedance, said third characteristic impedance and said fourth characteristic impedance are of the same impedance value or the different impedance value, and said first electrical length, said second electrical length, said third electrical length and said fourth electrical length are of the same electrical length or the different electrical length.

* * * * *